United States Patent [19]

Berstein et al.

[11] Patent Number: 5,250,948
[45] Date of Patent: Oct. 5, 1993

[54] HIGH LEVEL RESOLUTION ENHANCEMENT FOR DUAL-RANGE A/D CONVERSION

[75] Inventors: Lawrence J. Berstein, Honeoye Falls; Kenneth A. Parulski, Rochester, both of N.Y.

[73] Assignee: Eastman Kodak Company, Rochester, N.Y.

[21] Appl. No.: 810,230

[22] Filed: Dec. 19, 1991

[51] Int. Cl.$^5$ .................. H03M 1/62; H03M 1/06; H03M 1/18

[52] U.S. Cl. .................. 341/131; 341/118; 341/139; 341/141

[58] Field of Search .............. 341/131, 141, 155, 118, 341/139

[56] References Cited

U.S. PATENT DOCUMENTS

| | | |
|---|---|---|
| 4,398,179 | 8/1983 | Kaneko . |
| 4,589,023 | 5/1986 | Suzuki et al. . |
| 4,700,173 | 10/1987 | Araki et al. . |
| 4,751,496 | 6/1988 | Araki et al. . |
| 4,761,634 | 8/1988 | Yamaguchi et al. . |
| 4,812,846 | 3/1989 | Noro . |
| 4,875,048 | 10/1989 | Shimizu et al. . |
| 4,896,155 | 1/1990 | Craiglow . |
| 4,914,439 | 4/1990 | Nakahashi et al. ............ 341/131 |
| 4,916,449 | 4/1990 | Kubo et al. ............ 341/131 |
| 4,999,628 | 3/1991 | Kakubo et al. ............ 341/139 |
| 5,111,202 | 5/1992 | Rivera et al. ............ 341/131 X |
| 5,134,399 | 7/1992 | Hiller ............ 341/131 |

OTHER PUBLICATIONS

"Video A/D/ Converter", *EDN*, Oct. 11, 1990, pp. 150–158, Two-Step flash conversion, p. 152.

"High-Resolution Digitization of Photographic Images With an Area Charge-Coupled Device (CCD) Imager," *SPIE*, vol. 697 Applications of Digital Image Processing IX (1986), discussion of ganged flash A/D conversion.

"A Digital Telecine Processing Channel", Oliphant and Weston, *SMPTE Journal*, Jul. 1979, vol. 88, dicsussion of dithering on pp. 475–476.

"Picture Coding Using Pseudo-Random Noise," Roberts, *IEE Transactions Information Theory*, discussed by applicants in Background of Invention at pp. 5 and 6.

"High Resolution ADCS Up Dynamic Range in More Applications," Goodenough, *Electronic Design*, Apr. 11, 1991, discusses high resolution device architectures and design trade-offs.

*Primary Examiner*—Sharon D. Logan
*Attorney, Agent, or Firm*—Mark Z. Dudley

[57] ABSTRACT

A dual range A/D converter includes means for appending a predetermined number N of random noise bits to the N least significant bits of the digital signals output from one of the dual A/D converters, thereby providing a total output bit resolution that is independent of the input analog signal.

6 Claims, 5 Drawing Sheets

HIGH LEVEL RESOLUTION ENHANCEMENT FOR DUAL-RANGE A/D CONVERSION

FIELD OF THE INVENTION

This invention pertains to the field of digital signal processing and, in particular, to the field of analog to digital (A/D) conversion.

BACKGROUND OF THE INVENTION

The digitization of a high bandwidth analog signal having a large dynamic range requires analog to digital conversion means having a correspondingly high dynamic range capability. Other performance characteristics include the accuracy of the converter, which is defined in absolute terms as the number of bits to which the output signal correlates with the "ideal" digital representation of the analog input signal; and resolution, which is commonly expressed as the number of bits M where the converter has $2^M$ possible states. The highest performance monolithic conversion devices have difficulty providing better than 10 bit resolution at 75 million samples/second of high dynamic range signals.

The coding requirements for a telecine (a machine for converting film images into video signals) are more stringent than for other video systems, e.g., a video camera. Telecines that digitize the video signal directly have especially stringent A/D converter resolution and accuracy requirements, because the film scanned by the telecine has particular characteristics that need to be compensated in order to provide good television pictures. In particular, the telecine must process a much larger input contrast range than a live camera because of the expansion in contrast produced by the film gamma. If the digitization of the primary R, G, B signals take place before gamma correction, at least 11 bits are ordinarily needed for a telecine video processing channel.

Various methods have been used to achieve a large dynamic range capability in the high-resolution analog-to-digital circuitry of a video system. Four typical ones include the use of a signal compandor, such as a logarithmic amplifier upstream of the A/D converter; parallel conversion; sub-ranging multiple converters; and level-dependant (dual-range or range-changing) converter architectures.

Signal companding A/D converter circuits have a signal dependent bandwidth and an unsymmetrical pulse response. The matching of the companding function in multiple channel systems (Red, Green, Blue) is also problematic. High speed, single-stage A/D converters in the form of parallel, or flash, conversion stages, and multi-state A/D converters (e.g., subranging converters) are still very costly and complex to implement in high dynamic range, high-resolution configurations.

With respect to signals that have been linearly coded and subsequently gamma corrected, tests of visibility of the quantization effects indicate that the smallest perceived fractional change in luminance is about 2%, and the perceived fractional change does not rise rapidly above 2% until the signal level falls to below about 15%. A preamplification factor of 8 can be applied to input signals falling below 12.5% of peak (the predetermined threshold) to add three bits at signal levels below 12.5% (see "A Digital Telecine Processing Channel," by A. Oliphant and M. Weston, *SMPTE Journal*, July 1979, vol. 88, pp. 474-480).

For example, the model B3410 Telecine, manufactured by Marconi Communications Systems Ltd., England, provides 11 bit A/D conversion by use of an 8 bit A/D converter and a gain switching system. The A/D conversion has two ranges: a normal accuracy range and a fine accuracy range. Input signals falling between 12.5% and 100% of peak white are digitized over the whole 8 bit range of the converter to provide eight MSBs of the output signal. Input signals falling below 12.5% of peak are amplified eight times and then digitized to provide eight LSBs of the 11 bit output signal. (See "Digital Video Processing for Telecine," by R. Matchell, IBC 1981, *IEE Conference Publication* N110, IEE London, U.K., pgs. 41-45; "The Marconi B3410 Line Array Telecine," by R. Matchell, *SMPTE Journal*, November 1982, pp. 1066-1070).

Hence, to achieve greater resolution without the greatly increased complexity of developing an extended range A/D converter, certain converter circuits have been devised wherein low-cost converters (e.g. 8-bit A/D converters) are modified so as to insert analog preamplification whenever the input signal falls below a predetermined threshold. The preamplification factor is ordinarily an exact power of 2; thus the eight-bit word from the A/D converter can be located within a longer word by simply displacing it by the appropriate number of binary places.

Such level-dependent A/D converters are sometimes called dual range (or range-changing) converters, and typically include two separate conversion paths wherein one path has gain equal to a multiple of the gain of the other path. A comparator, or a comparison-type operation, switches the input samples from one path to the other as the input video signal level passes a preset threshold level. One approach is to "gang" together two flash A/D converters such that the low gain path in effect has a coarser step size than the high gain path (see the dual-ranging A/D converter disclosed in "High-resolution digitization of photographic images with an area charge-coupled device (CCD) imager" by J. R. Milch, SPIE Vol. 697, *Applications of Digital Image Processing IX* (1986), pp. 96-104).

A known dual range A/D converter of this type is shown in FIG. 1. Input analog signals are applied to a first M bit A/D converter 10 that is used in a low gain signal path A to generate first digital signals and a second M bit A/D converter 12 that is used in a high gain signal path B to generate second digital signals. The low gain path A is provided with unity gain from an amplifier 14 while the high gain path B is provided with a gain of 2N from an amplifier 16. The low gain path is used when the input signal $V_{IN}$ is greater than (Vmax/2N) and the high gain path is used when the input signal is less than or equal to (Vmax/2**N). (Vmax is the maximum value that signal $V_{IN}$ may become.)

A comparator 18 compares the code values of the second digital signals to a suitable switch-over code word (usually just less than Vmax/2**N) and thereby controls a digital multiplexer 20 to select the data path to be utilized. (An overflow flag (OVF) from the second A/D converter 12 could also be used to control the multiplexer 20. Similarly, an analog comparator could be used to compare the analog input to the A/D converters 10 and 12.)

The multiplexer 20 includes registers 20a and 20b for assembling an output code word from the M data bits and N zero bits, the latter being joined to the M data bits to fill out the output code word. The output of the multiplexer 20 thus is (M+N) bits, wherein the N bits form the zero LSBs of the low gain signal path A and the highest MSBs of the high gain signal path B. In a typical application, the M bit A/D converters 10 and 12 are conventional 9 bit (M=9) flash-type A/D converters, and a gain of eight (i.e., N=3) is applied to the high gain path B, thereby resulting in an output of 12(M+N) bits from the multiplexer 20. This results in two accuracy ranges; high accuracy at low signal levels and low accuracy at high signal levels (see FIG. 2). (The added accuracy N, is determined by the log base 2 of the gain in the amplifier prior to the lower A/D converter 12, while the base accuracy M is determined by the individual A/D converter. The resultant data word size is (M+N) bits.) This can be thought of as a crude approximation to the characteristics of the human visual system, and provides a near constant (quantization step size to input signal level) ratio after digitization.

The signal paths of the dual range A/D converter shown in FIG. 1 have an equivalent digital accuracy (analog signal versus A/D conversion accuracy) for each individual A/D converter as illustrated in FIG. 2.

Techniques such as adding analog dither to the image signal, appending digital noise with an appropriate probability density function (PDF) to the lower order bits, and the use of "Roberts Noise" (Roberts, L.G., "Picture Coding Using Pseudo-Random Noise", *IRE Transactions On Information Theory*. February 1962) have been commonly used in imaging systems to break up contouring effects and reduce quantization visibility. Although these methods reduce the number of bits required by the A/D converter, they do not address the above-described dynamic range requirements of the telecine and other video systems having stringent dynamic range requirements.

SUMMARY OF THE INVENTION

The foregoing disadvantages of the prior art are overcome by a dual range A/D architecture having a high level resolution enhancement feature. A large dynamic range capability is achieved by implementing the conversion such that the resolution of the digital representation is not signal dependent, in contrast to conventional dual-range and companding A/D conversion architectures.

A dual range converter according to the invention is operative in two signal paths, a first signal path including a first analog-to-digital converter for converting analog input signals into first digital signals, and a second signal path including a second analog-to-digital converter for converting analog input signals into second digital signals. Signal gain is applied to the respective paths such that the gain applied to the second path is a nominal multiple of the gain applied to he first path. In the preferred embodiments of the invention, the high-order A/D converter is selectively augmented using one of two resolution-enhancement techniques to "fill in" the missing lower order bits, ($\log_2$ of the amplifier gain prior to the lower order A/D converter), to eliminate contouring artifacts, and any visible discontinuities at the change-over point.

BRIEF DESCRIPTION OF THE DRAWINGS

The present invention will become more apparent when taken in conjunction with the following description and drawings, wherein like characters indicate like parts and wherein the drawings form a part of the present description.

DESCRIPTION OF THE PREFERRED EMBODIMENTS

Figure 3:
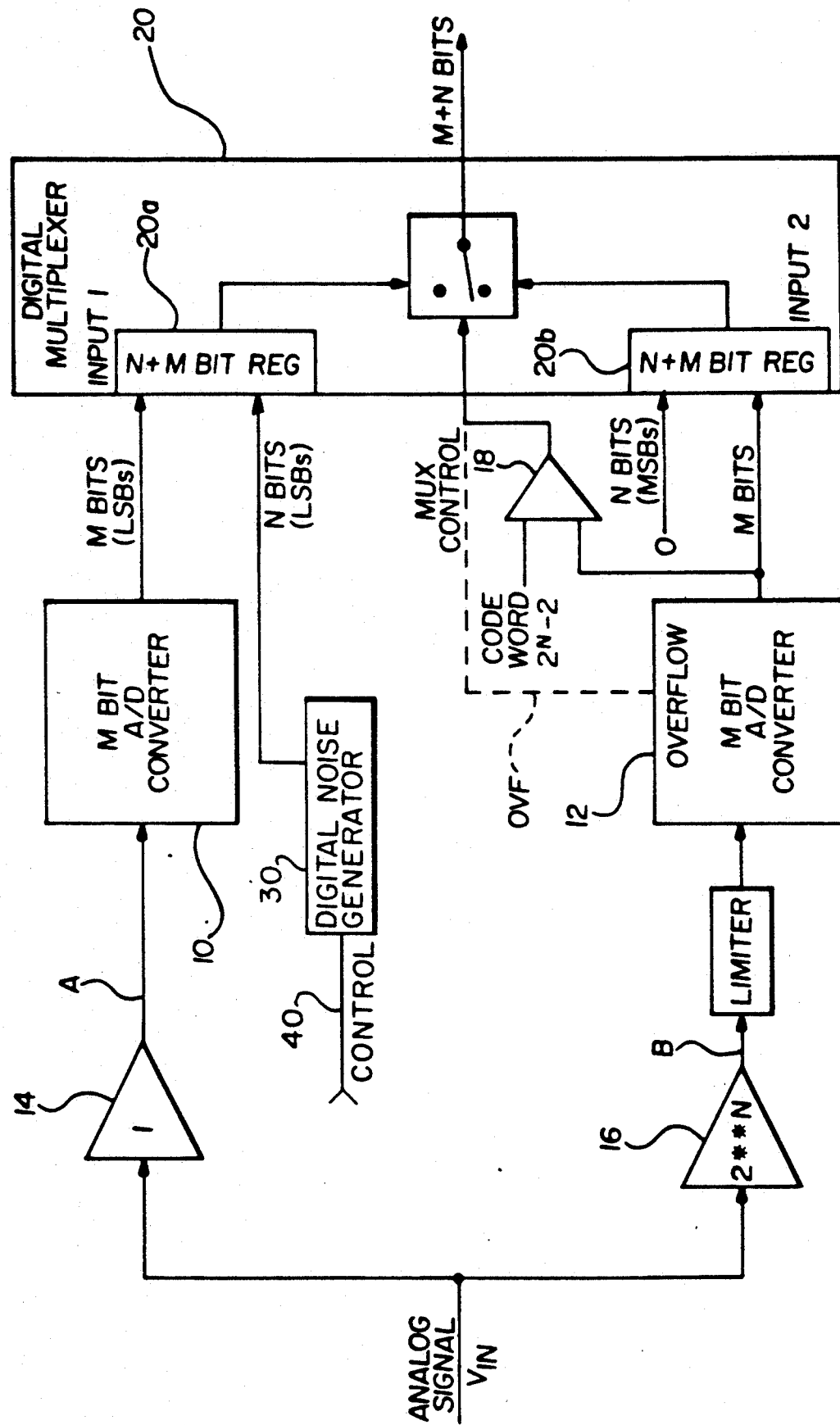
FIGS. 3 and 4 are block diagrams of first and second preferred embodiments of a dual range A/D converter incorporating high resolution enhancement circuitry in accordance with the invention.
Figure 4:
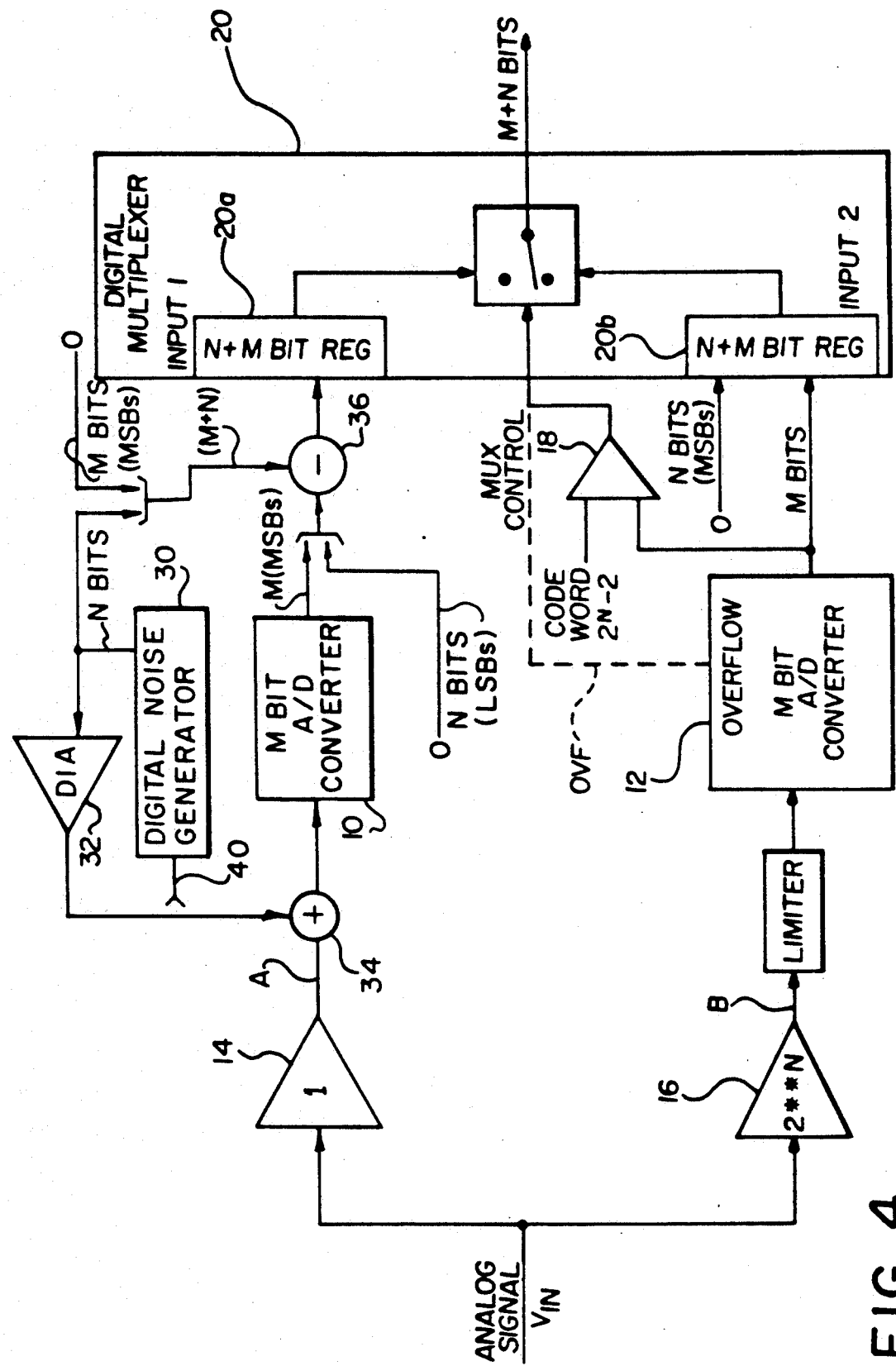

In describing the preferred embodiments of a dual range A/D converter as shown in FIGS. 3 and 4, identical reference numerals are used to describe elements already discussed in relation to the preceding figures.

Figure 1:
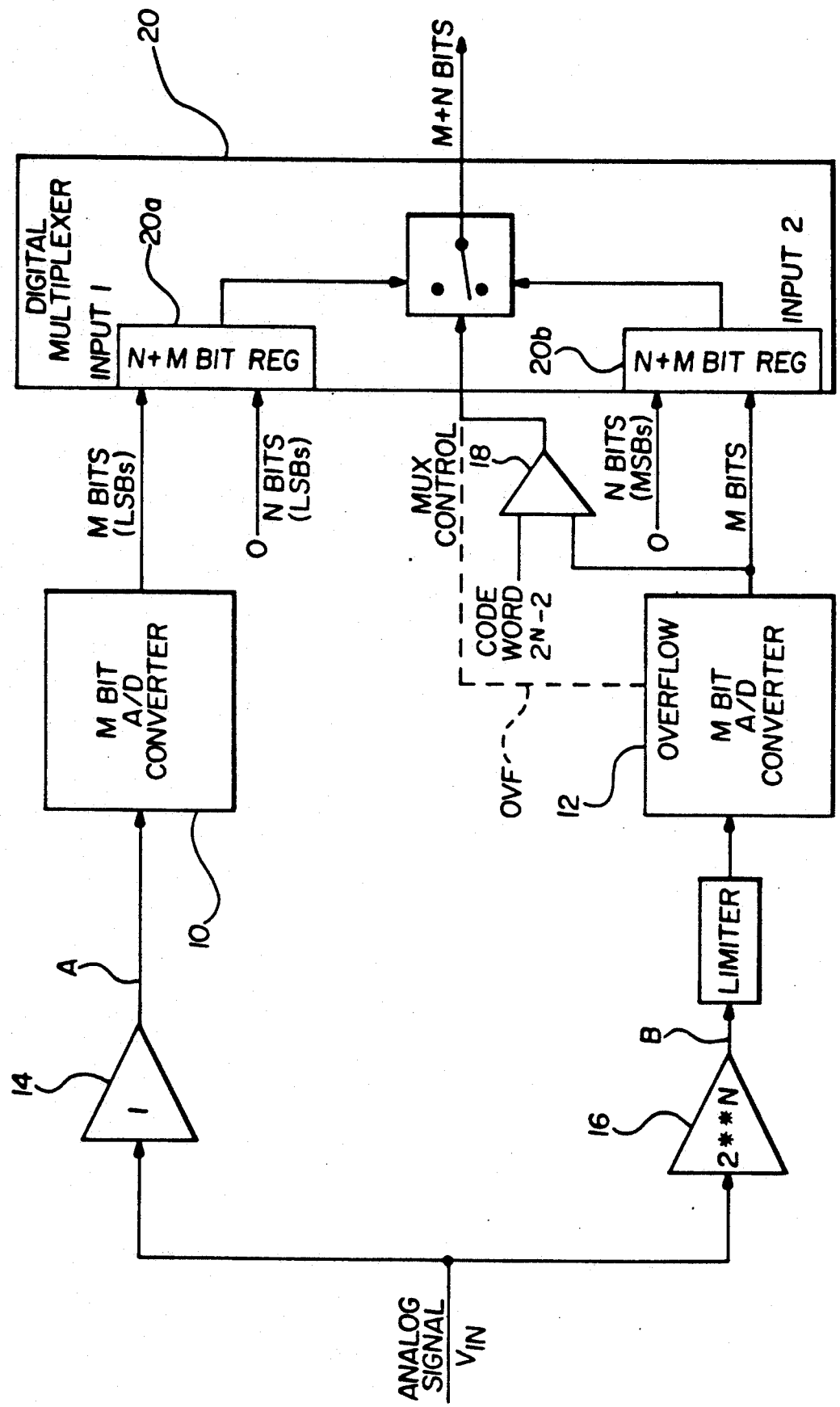
FIG. 1 is a block diagram of a known dual range A/D converter utilizing two A/D converters.
Figure 2:
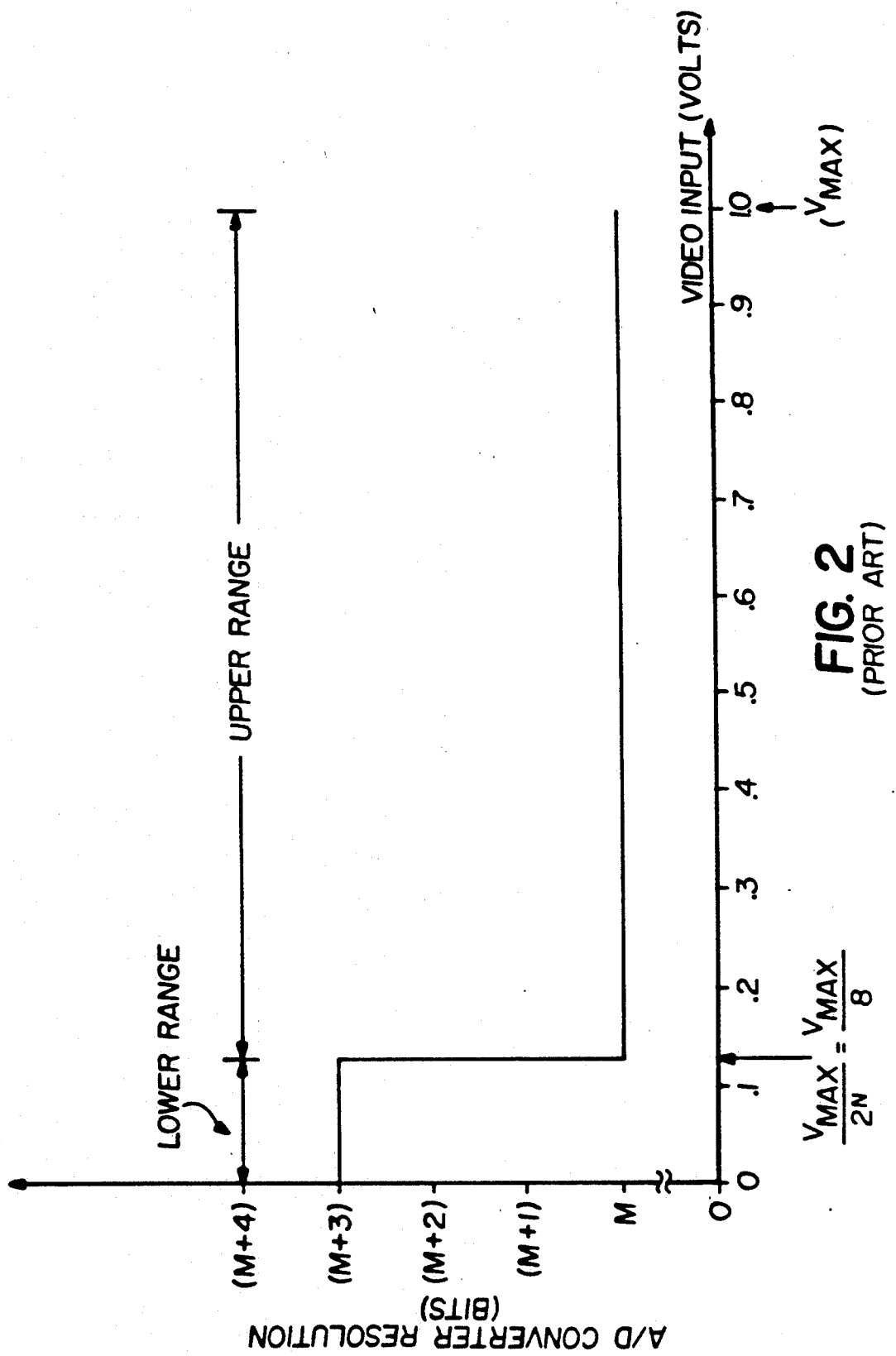
FIG. 2 is a graph showing the bit resolution for each range of the dual range A/D converter shown in FIG. 1.

As was shown in FIGS. 1 and 2, there are two signal paths in the conventional dual range converter scheme: an upper path with unity gain and M bits resolution, which is used when the input signal Vin is >(Vmax/2N); and a lower signal level path with a gain of 2N and M Bits resolution for use when the input signal Vin is ≦(Vmax/2**N). An overflow flag OVF from the lower A/D converter is then used to control the digital multiplexer 20 which selects the data path to be utilized, resulting in two accuracy ranges: high accuracy at low signal levels, and low accuracy at high signal levels.

The added accuracy is determined by the $\log_2$ of the gain in the amplifier prior to the lower order A/D converter, while the base accuracy is determined by the A/D converter used. This can be thought as a crude approximation to a "log" function which, when digitized, provides constant accuracy relative to the signal level. The overall output word size is equal to (M+N) bits.

Signal dependent resolution is inherent in the design of the prior art dual range A/D conversion architecture of FIG. 1. A discontinuity in the signal resolution will result when the signal level crosses the transition point between the two A/D converters. The lower signal resolution at high signal levels can result in visible image contouring, depending on the image content, film type, and color grading (Digital Look-up Table) conditions.

Hence, in a departure from the prior art according to the present invention, by implementing a dual range conversion architecture with selective use of a high level resolution enhancement technique, it will be possible to eliminate the signal-dependent resolution artifact.

In a first preferred embodiment illustrated in FIG. 3, the invention contemplates appending additional noise bits, and in a second preferred embodiment illustrated in FIG. 4, the invention contemplates appending noise bits via the selective insertion and removal of Roberts noise.

As generally described in connection with FIG. 1, and as further shown in FIGS. 3 and 4, the output word from the digital multiplexer 20 comprises (M+N) bits, or, in the case of the preferred embodiment, a 12 bit output word (M=9, N=3). In the low gain path A, the M bits, which are obtained from the A/D converter 10 become the MSBs. In the high gain path B, the N output MSBs are set to zeros and the M output LSBs are obtained from the A/D converter 12. The N (three) zero bits in the output word derived from the high gain path B are meaningful bits, and the dual-range A/D converter therefore has 12 bit (M+N) resolution.

Appending N LSBs of noise to the upper A/D converter M bit word (as shown in FIG. 3) is accomplished by modifying the prior art dual range A/D converter using a N bit random noise generator 30 to randomly vary these bits on a pixel to pixel basis, thus increasing the digital resolution for signals digitized by the upper A/D converter.

Adding "Robert's Noise" to the prior art dual range A/D converter (via the generator 30 as shown in FIG. 4) improves the conversion process by actually increasing the signal resolution of the upper A/D converter through the use of signal "dithering". The N bit noise generator 30 provides an equivalent analog noise signal that is converted to an analog signal via a D/A converter 32. The analog noise signal is added to the output of the amplifier 14 by an adder 34. After the digitization in the low gain signal path, the M bit digital word is first appended with N zeros for the LSBs and is then applied to the positive input of the subtractor 36. An N bit digital noise word with M appended zeros for the MSBs is also applied to the negative input of the subtractor 36, and the difference results in the (M+N) bit digital word presented to input 1 of the digital multiplexer 20.

The contemplated noise appending scheme may be effected continuously or may be selectively controlled by an appropriate signal on a control line 40 when, for example, a set point in the lookup table LUT gain (f'(x)) characteristic is exceeded.

Figure 5:
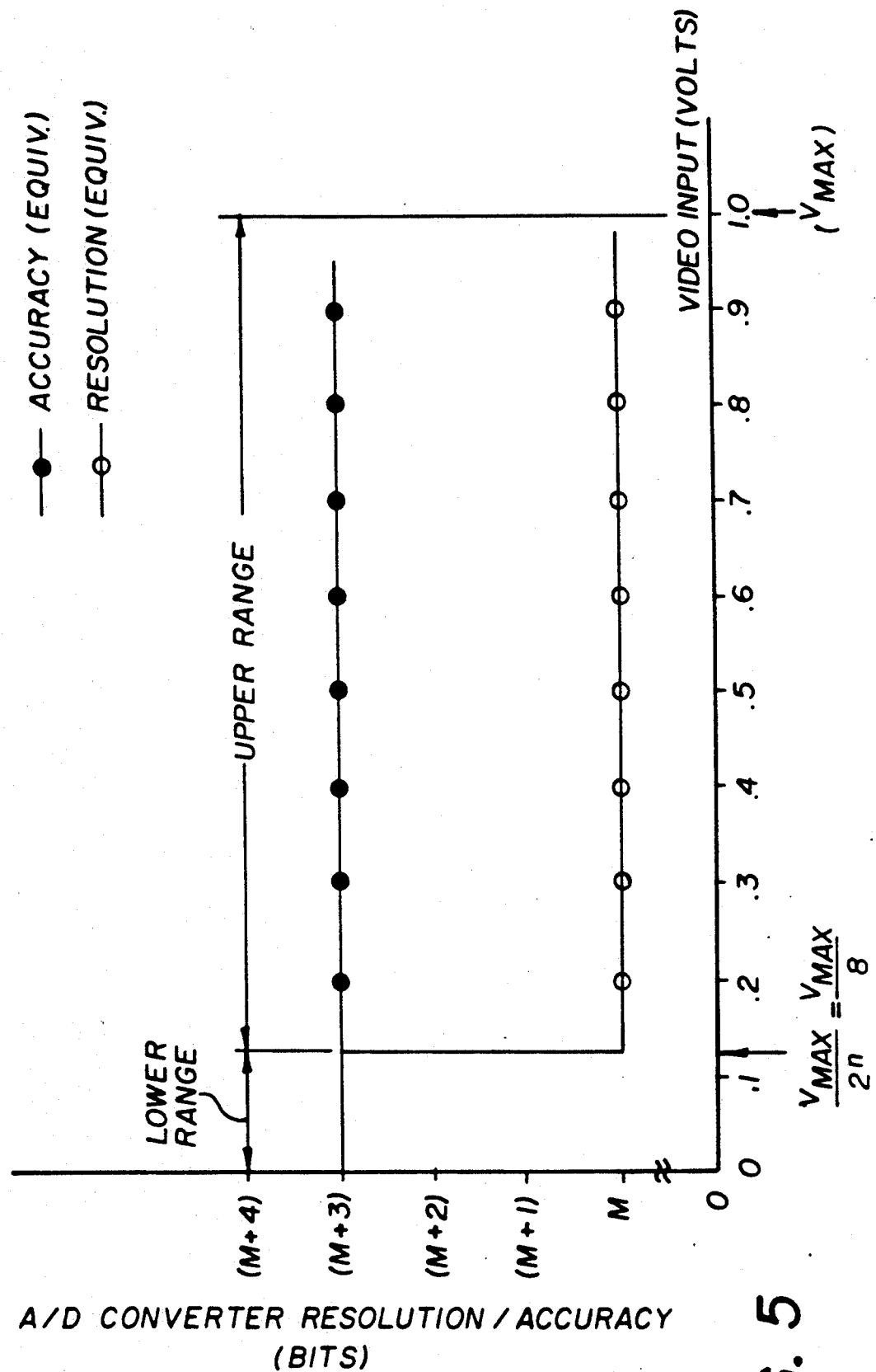
FIG. 5 is a graph showing the bit resolution and accuracy for each range of the dual range A/D converter shown in FIGS. 4 and 5.

These techniques result in a dual range A/D converter design whose digital resolution is signal independent. Note that addition of resolution enhancement to the higher order A/D does not alter the fact that the accuracy of the system is nonetheless signal dependent, as shown in FIG. 5. Fortunately, signal-dependent accuracy is not critical due to the system noise characteristics and the inability of the human perceptual system to discern the variation in accuracy with signal change.

The invention has been described in detail with particular reference to a presently preferred embodiment, but it will be understood that variations and modifications can be effected within the spirit and scope of the invention. For instance, the invention can be extended to a multi-range A/D converter, which has more than two level-dependent signal paths. Using multiple paths has several benefits despite the added complexity. For example, the ratio of quantization step size to input signal can more nearly approach a constant value, which allows an even better approximation to the characteristics of the human visual system.

It is also worthy of note that, as higher resolution parallel A/D converters become available, the dual-range converter described herein continues to have merit both as an inexpensive alternative to expensive high resolution converters and as a preferred architecture for yet greater resolutions and higher data rates.

What is claimed is:

1. A dual range analog-to-digital converter for converting analog input signals into digital output signals, the digital signals having code values corresponding to the analog levels of the input signals, said converter comprising:
   a first signal path including a first analog-to-digital converter for converting the analog input signals into first digital signals;
   a second signal path including a second analog-to-digital converter for converting the analog input signals into second digital signals;
   amplification means for providing signal gain in the respective signal paths, the gain applied to the second path being a nominal multiple of the gain applied to the first path;
   multiplexing means responsive to the the signals in the respective signal paths for generating the digital output signals from either the first signal path or the second signal path;
   means for appending a predetermined number N of random noise bits as the N least significant bits of the first digital signals, and
   means for adding N bits of a predetermined value to the N most significant bits of the digital signal in said second path.

2. A dual range analog-to-digital converter as claimed in claim 1, wherein the means for appending noise further comprises digital output noise signal generating means for adding a predetermined number of least significant digital noise bits to the first digital signal in said first path.

3. A dual range analog-to-digital converter as claimed in claim 1, wherein the means for appending noise further comprises:
   means for providing a digital noise signal;
   means for converting the digital noise signal to an analog noise signal;
   means for adding the analog noise signal to the analog signal received by the first analog-to-digital converter; and
   means for subtracting the digital noise signal from the first digital signals.

4. A dual range analog-to-digital converter as claimed in claim 1 wherein the number N corresponds to the gain applied to said second path.

5. A dual range analog-to-digital converter as claimed in claim 4 wherein the number N of said bits equals 3.

6. A dual range analog-to-digital converter as claimed in claim 1 wherein said amplification means provides signal gain in said second signal path of the analog input signals by a factor of $2^N$.

* * * * *